(12) United States Patent
Iguchi et al.

(10) Patent No.: US 8,373,072 B2
(45) Date of Patent: Feb. 12, 2013

(54) PRINTED CIRCUIT BOARD

(75) Inventors: Daisuke Iguchi, Kanagawa (JP); Kanji Otsuka, Tokyo (JP); Yutaka Akiyama, Tokyo (JP)

(73) Assignee: Fuji Xerox Co., Ltd., Tokyo (JP)

( * ) Notice: Subject to any disclaimer, the term of this patent is extended or adjusted under 35 U.S.C. 154(b) by 517 days.

(21) Appl. No.: 12/501,931

(22) Filed: Jul. 13, 2009

(65) Prior Publication Data

US 2010/0013318 A1 Jan. 21, 2010

(30) Foreign Application Priority Data

Jul. 15, 2008 (JP) .................................. 2008-184050

(51) Int. Cl.
*H05K 1/03* (2006.01)
(52) U.S. Cl. ........................................................ 174/259
(58) Field of Classification Search ........... 174/255–259
See application file for complete search history.

(56) References Cited

U.S. PATENT DOCUMENTS

| | | | |
|---|---|---|---|
| 5,428,506 A | 6/1995 | Brown et al. | |
| 6,166,457 A | 12/2000 | Iguchi et al. | |
| 7,459,638 B2 * | 12/2008 | Chen et al. | 174/255 |
| 2006/0237223 A1 | 10/2006 | Chen et al. | |

FOREIGN PATENT DOCUMENTS

| | | |
|---|---|---|
| JP | 7-14018 A | 1/1995 |
| JP | 3036629 B2 | 2/2000 |
| JP | 2003-218541 A | 7/2003 |
| JP | 2004-363347 A | 12/2004 |
| JP | 2006-294967 A | 10/2006 |

OTHER PUBLICATIONS

Cuming Microwave, C-RAM RGD Technical Bulletin 330-1, Jun. 13, 2007, Document Control No. N-10-000-00028-C.*
Masanori Hashimoto et al., "Eye-Pattern Evaluation of On-Chip Interconnects with Intentional Shunt Conductance", Proceedings of the IEICE General Conference, 2007, p. 99, A 3-9.
Communication dated Jul. 10, 2012 issued by the Japanese Patent Office in counterpart Japanese Application No. 2008-184050.

* cited by examiner

*Primary Examiner* — Jeremy Norris
(74) *Attorney, Agent, or Firm* — Sughrue Mion, PLLC

(57) ABSTRACT

A printed circuit board includes a ground layer, a power source layer, a signal wiring layer, an insulating layer and an electromagnetic radiation suppressing member. The power source layer is provided to be opposed to the ground layer. The signal wiring layer transmits a signal in a predetermined frequency domain. The insulating layer insulates the ground layer, the power source layer and the signal wiring layer from one another. The electromagnetic radiation suppressing member is provided to cover a circumferential edge of the insulating layer. The electromagnetic radiation suppressing member has a negative dielectric constant and a positive magnetic permeability in a frequency domain including the predetermined frequency domain.

4 Claims, 9 Drawing Sheets

PRINTED CIRCUIT BOARD

CROSS-REFERENCE TO RELATED APPLICATIONS

This application is based on and claims priority under 35 USC 119 from Japanese Patent Application No. 2008-184050 filed on Jul. 15, 2008.

BACKGROUND

1. Technical Field

The present invention relates to a printed circuit board.

2. Related Art

In recent years, unwanted radiation of electromagnetic waves (electromagnetic radiation) has become a problem in various kinds of electronic equipment. It has been known that electromagnetic radiation is chiefly caused not by a signal line but a power source system, that is, caused by electric resonance between a power source layer and a ground layer in a printed circuit board. For example, when a multi-layer printed circuit board has a power source layer and a ground layer which are quadrilateral, the printed circuit board serves as a parallel plate resonator to generate a natural resonance frequency (standing wave) between the power source layer and the ground layer.

SUMMARY

According to an aspect of the invention, a printed circuit board includes a ground layer, a power source layer, a signal wiring layer, an insulating layer and an electromagnetic radiation suppressing member. The power source layer is provided to be opposed to the ground layer. The signal wiring layer transmits a signal in a predetermined frequency domain. The insulating layer insulates the ground layer, the power source layer and the signal wiring layer from one another. The electromagnetic radiation suppressing member is provided to cover a circumferential edge of the insulating layer. The electromagnetic radiation suppressing member has a negative dielectric constant and a positive magnetic permeability in a frequency domain including the predetermined frequency domain.

BRIEF DESCRIPTION OF THE DRAWINGS

Exemplary embodiments of the invention will be described below in detail with reference to the accompanying drawings, wherein.

DETAILED DESCRIPTION

A printed circuit board according to an exemplary embodiment of the invention has a ground layer, a power source layer, a signal wiring layer, an insulating layer and an electromagnetic radiation suppressing member. The power source layer is provided to be opposed to the ground layer. The signal wiring layer transmits a signal in a predetermined frequency domain. The insulating layer insulates the ground layer, the power source layer and the signal wiring layer from one another. The electromagnetic radiation suppressing member is provided to cover a circumferential edge of the insulating layer. The electromagnetic radiation suppressing member has a negative dielectric constant and a positive magnetic permeability in a frequency domain including the predetermined frequency domain.

The printed circuit board may be either a multi-layer board having three or more layers of wiring patterns or a two-layer board having two layers of wiring patterns.

In the aforementioned configuration, when a signal in the predetermined frequency domain is transmitted to the signal wiring layer, the electromagnetic radiation suppressing member behaves as metal in the frequency domain including the predetermined frequency domain. Thus, even if electromagnetic waves are generated due to resonance between the ground layer and the power source layer, the electromagnetic waves can be absorbed by the electromagnetic radiation suppressing member so that electromagnetic radiation can be suppressed.

[First Exemplary Embodiment]

Figure 1A:
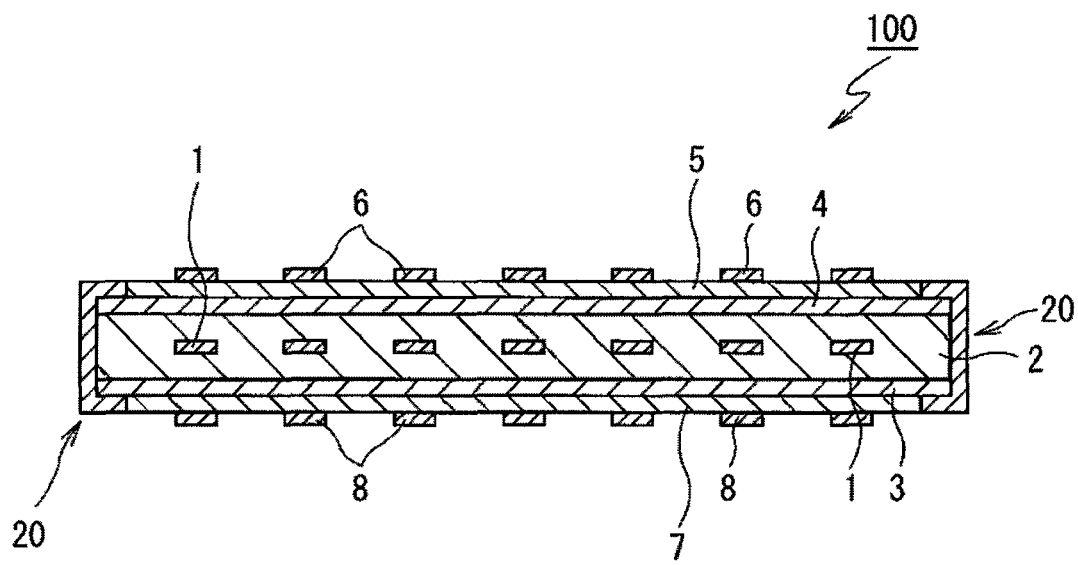
FIGS. 1A and 1B show a printed circuit board according to a first exemplary embodiment of the invention, FIG. 1A being a sectional view showing the whole of the same, and FIG. 1B being a sectional view showing a side portion of the same in detail.
Figure 1B:
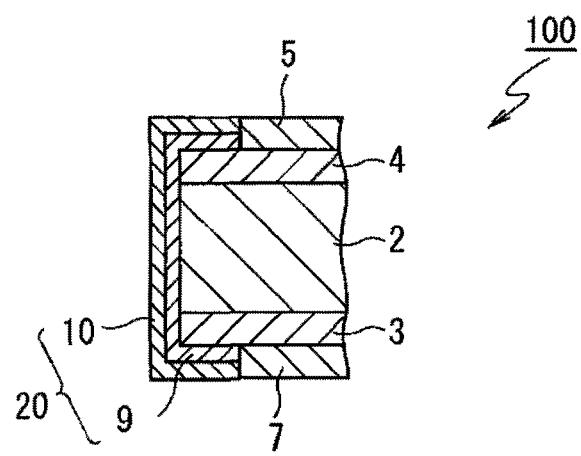

FIGS. 1A and 1B show a printed circuit board according to a first exemplary embodiment of the invention. FIG. 1A is a sectional view showing the printed circuit board as a whole, and FIG. 1B is a sectional view showing a side portion thereof in detail.

The printed circuit board 100 has an insulating layer 2, a power source layer 3, a ground layer 4, a first insulating substrate layer 5, plural second signal wiring layers 6, a second insulating substrate layer 7, plural third signal wiring layers 8, and an electromagnetic radiation suppressing member 20 as shown in FIG. 1A. The insulating layer 2 has a shape such as a quadrangle or the like. Plural first signal wiring layers 1 are provided in an intermediate portion of the insulating layer 2 and on one and the same plane so as to have predetermined patterns. The power source layer 3 is provided on one surface (lower surface) of the insulating layer 2. The ground layer 4 is provided on the other surface (upper surface) of the insulating layer 2. The first insulating substrate layer 5 has a smaller area than the ground layer 4, and is provided on the ground layer 4. The second signal wiring layers 6 are provided on the surface of the first insulating substrate layer 5 so as to have predetermined patterns. The second insulating substrate layer 7 has a smaller area than the power source layer 3 and is provided on the surface of the power source layer 3. The third signal wiring layers 8 are provided on the surface of the second insulating substrate layer 7 so as to have predetermined patterns. The electromagnetic radiation suppressing member 20 is provided to cover the circumferential edges of the insulating layer 2 and the first and second insulating substrate layers 5 and 7.

As shown in FIG. 1B, the electromagnetic radiation suppressing member 20 includes an insulating sheet 9 and a thin film layer 10 which are put on each other. The electromagnetic radiation suppressing member 20 is provided to cover all the side surfaces of the insulating layer 2, the power source layer 3 and the ground layer 4 and further cover predetermined portions of surfaces of the first and second insulating substrate layers 5 and 7. That is, the electromagnetic radiation suppressing member 20 is provided like a U-shape. The insulating sheet 9 may be omitted when the power source layer 3 and the ground layer 4 are located on the inner side of the end surface of the insulating layer 2 so as not to be in contact with the thin film layer 10.

The insulating sheet 9 is, for example, made of a polyester film which is 20 to 10,000 nm thick. The insulating sheet 9 may be provided directly on the side surfaces of the insulating layer 2 and the first and second insulating substrate layers 5 and 7 by application, spin coating, sputtering, deposition, CVD, spray coating or the like. Alternatively, the thin film layer 10 formed on the insulating sheet 9 may be pasted onto the side surfaces of the insulating layer 2 and the first and second insulating substrate layers 5 and 7 by use of an adhesive or the like.

The thin film layer 10 is an insulating sheet which is, for example, 20 to 10,000 nm thick and which includes a thin film or cluster-like particles with a sheet resistance of 1 Ω/□ or higher. The thin film layer 10 is provided on the surface of the insulating sheet 9 by CVD, deposition, sputtering, spray coating or the like. The thin film layer 10 may be, for example, produced by PVD (Physical Vapor Deposition). Examples of other deposition techniques include CVD (Chemical Vapor Deposition), PE-CVD (Plasma Enhanced-CVD), etc.

An alloy or a eutectoid made from at least one selected from the group consisting of Fe, Al, Ni, Ag, Mg, Cu, Si and C may be recommended as the aforementioned particles. Particularly, Al is preferred because it has unpaired electrons in the 3 p orbits, and has a positive magnetic permeability in a region where the unpaired electrons behave as magnons due to interaction with electromagnetic waves. Further, when the particles are nanosized, there is an advantage that the density of unpaired electrons in the surface can be increased sharply, so that the magnon resonance frequency can be increased.

The particle size, density, etc. of the particles are selected suitably in accordance with the frequency domain of signals to be transmitted through the first to third signal wiring layers 1, 6 and 8.

(Characteristics of Electromagnetic Radiation Suppressing Member)

Figure 2A:
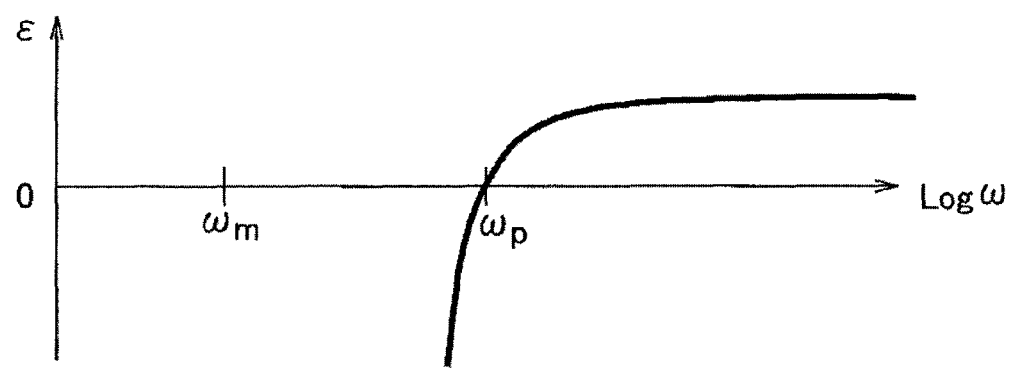
FIGS. 2A and 2B show a frequency characteristic of an electromagnetic radiation suppressing member in the printed circuit board according to the first exemplary embodiment of the invention, FIG. 2A being a frequency characteristic graph of the dielectric constant of the same, FIG. 2B being a frequency characteristic graph of the magnetic permeability of the same.
Figure 2B:
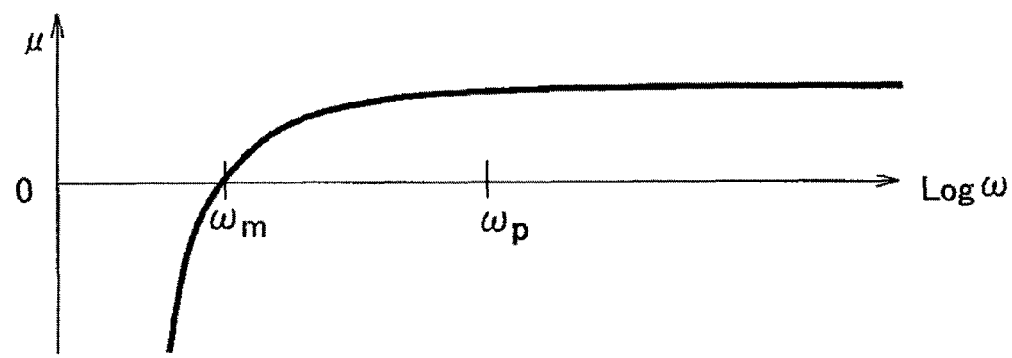

FIGS. 2A and 2B show frequency characteristics of the electromagnetic radiation suppressing member in the printed circuit board according to the first exemplary embodiment of the invention. FIG. 2A is a frequency characteristic graph of the dielectric constant, and FIG. 2B is a frequency characteristic graph of the magnetic permeability. As shown in FIG. 2A, the dielectric constant ε of the thin film layer 10 of the electromagnetic radiation suppressing member 20 is negative in a frequency domain lower than a frequency $\omega p$ (e.g. 100 GHz) where plasmon resonance will occur, and positive in a frequency domain higher than the frequency $\omega p$. This shows that the thin film layer 10 functions as a dielectric substance in the frequency domain higher than the frequency $\omega p$.

The plasmon resonance occurs as follows. That is, since the particles contained in the thin film layer 10 of the electromagnetic radiation suppressing member 20 are electrically metal or conductive, the particles have free electrons behaving as plasma in the surfaces thereof. Accordingly, the free electrons interact with high frequency photons at any frequency higher than a frequency obtained by the number of the particles.

On the other hand, as shown in FIG. 2B, the magnetic permeability μ of the thin film layer 10 is negative in a frequency domain lower than a frequency $\omega m$ (e.g. several MHz to 100 MHz) where magnon resonance will occur, and positive in a frequency domain higher than the frequency $\omega m$. This shows that the thin film layer 10 functions as a magnetic substance in the frequency domain higher than the frequency $\omega m$ and behaves as metal in the region between the frequency $\omega m$ and the frequency $\omega p$.

As is apparent from FIGS. 2A and 2B, the thin film layer 10 of the electromagnetic radiation suppressing member 20 has a positive magnetic permeability μ in a frequency domain higher than a very high frequency (VHF), and behaves as metal in a region between the very high frequency and a microwave frequency to reflect any electromagnetic field. The thin film layer 10 behaves dielectrically in an optical domain to allow any electric current to flow in the surface thereof but transmit any electromagnetic field. On the contrary, the magnetic permeability t becomes negative in a frequency domain lower than the very high frequency so that the thin film layer 10 behaves as a so-called metamaterial to have no conductivity in any DC (Direct Current).

For example, as shown in Proceedings of the IEICE General Conference, 2007, A-3-9, p. 99, "Eye-pattern Evaluation of On-chip Interconnects with Intentional Shunt Conductance", distortionless transmission can be achieved by inserting shunt conductance expressed of G=RC/L to a terminal end. This theory can be applied not only to a signal transmission line but also to a combination of the power source layer 3 and the ground layer 4. In this exemplary embodiment, the shunt conductance is formed by the electromagnetic radiation suppressing member 20. In order to reduce the resonance occurring between the power source layer 3 and the ground layer 4 without losing the power supply, it is necessary to suppress loss in DC satisfactorily while inducing sufficient conductance due to electromagnetic waves in a frequency domain causing an EMI problem.

The electromagnetic radiation suppressing member 20 has the aforementioned characteristics. Therefore, when the frequency domain between the frequency $\omega m$ and the frequency $\omega p$ is set as the frequency domain for signal transmission in the first to third signal wiring layers 1, 6 and 8, it is possible to satisfy the aforementioned conditions, that is, to induce the conductance in the frequency domain for the signal transmission while suppressing the loss in DC satisfactorily.

The present inventors found that no conductance is generated in the electromagnetic radiation suppressing member 20 when there is no interaction with electromagnetic waves propagated therein. That is, in any frequency domain other than the resonance frequency, there is no electromagnetic mode for propagation in a cavity formed between the power source layer 3 and the ground layer 4. Accordingly, there is no influence on the conductance. Therefore, the conductance is induced only by the resonance frequency.

(Impedance Characteristic of Printed Circuit Board)

Figure 3A:
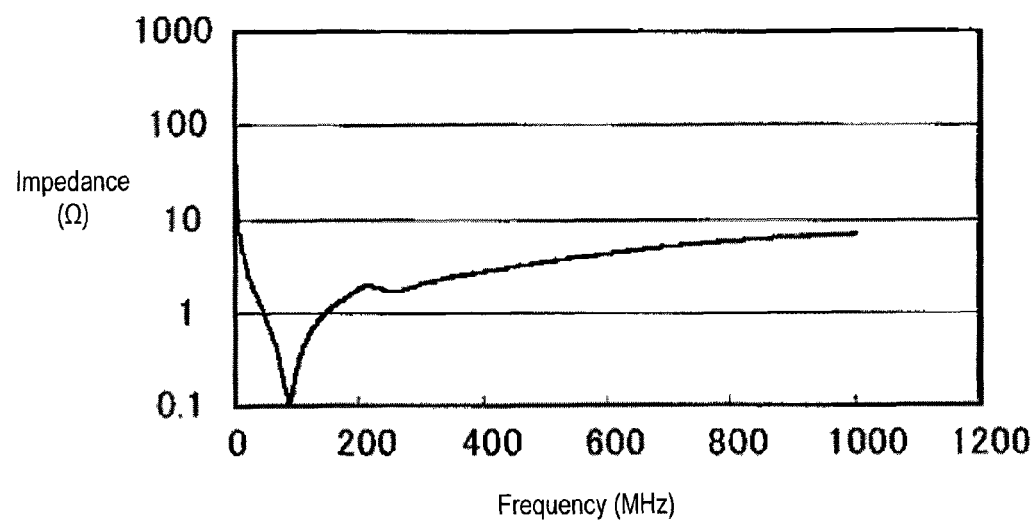
FIG. 3A is an impedance characteristic graph of the printed circuit board shown in FIGS. 1A and 1B.
Figure 3B:
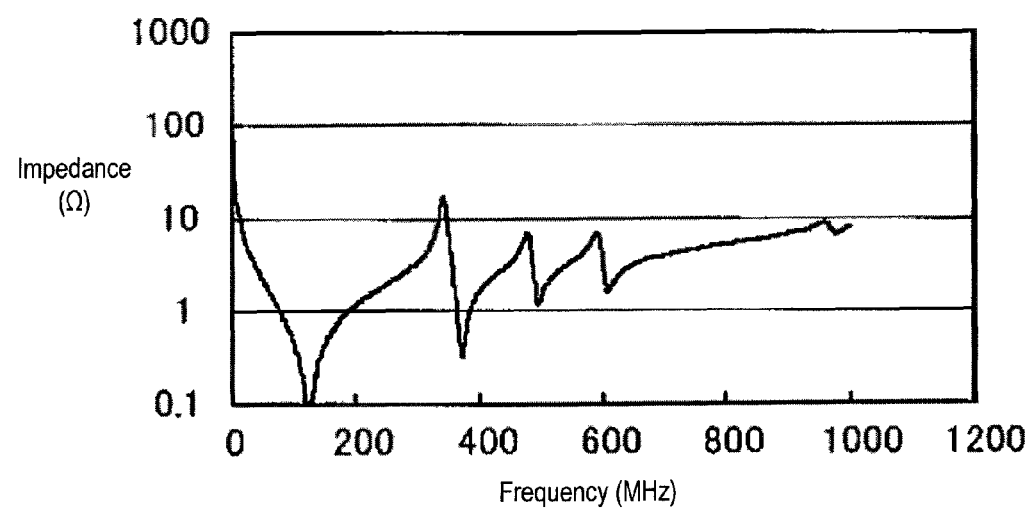
FIG. 3B is an impedance characteristic graph of a printed circuit board where the electromagnetic radiation suppressing member has been removed from the printed circuit board shown in FIGS. 1A and 1B.

FIG. 3A is an impedance characteristic graph of the printed circuit board shown in FIGS. 1A and 1B. FIG. 3B is an impedance characteristic graph of a printed circuit board where the electromagnetic radiation suppressing member has been removed from the printed circuit board shown in FIGS. 1A and 1B. As shown in FIG. 3B, in the printed circuit board (background-art configuration) where the electromagnetic radiation suppressing member 20 is removed from the printed circuit board 100, resonance occurs in plural frequencies. On the other hand, in the printed circuit board 100 according to this exemplary embodiment shown in FIG. 3A, resonance occurs in one frequency, and the impedance is stable in VHF or higher band. From this fact, it can be seen that there is no influence on the impedance (power source system impedance) between the power source layer 3 and the ground layer 4.

(Equivalent Magnetic Current and Electric Field in Printed Circuit Board)

Figure 4:
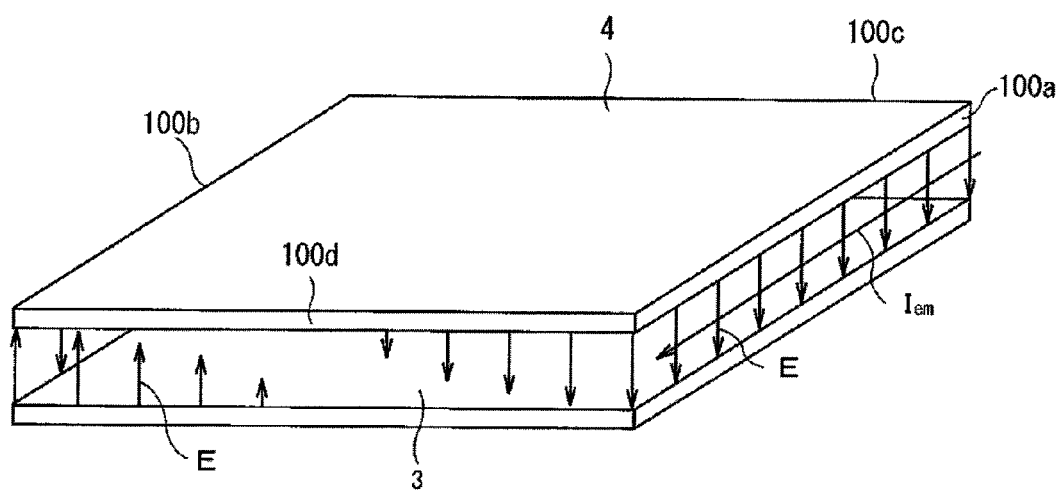
FIG. 4 is a view for explaining generation of an equivalent magnetic current and an electric field in the printed circuit board according to the first exemplary embodiment of the invention.

FIG. 4 is a view for explaining generation of an equivalent magnetic current and an electric field in the printed circuit board according to the first exemplary embodiment of the invention. When the power source layer 3 and the ground layer 4 form a parallel plate resonator and are at a resonance frequency, an electric field E between the power source layer 3 and the ground layer 4 has a maximum potential difference in opposite end portions (opposite left and right ends in FIG. 4) 100a and 100b as shown in FIG. 4. An equivalent magnetic current $I_{em}$ perpendicular to the electric field E is generated in the opposite end portions 100a and 100b where the electric field E is generated. TEM (Transverse Electromagnetic Mode, which is a waveguide mode where an electric field component and a magnetic field component are zero in a propagation direction) waves based on the equivalent magnetic current $I_{em}$ are radiated as electromagnetic waves into the space. The electromagnetic waves induce conductivity in the thin film layer 10 of the electromagnetic radiation suppressing member 20. Since the thin film layer 10 serves as a conductive substance, resonance energy is consumed between the power source layer 3 and the ground layer 4. As a result, a resonance current between the power source layer 3 and the ground layer 4 is suppressed. At the same time, radiation of the electromagnetic waves from the board end portions is reduced.

(Return Loss Characteristic)

Figure 5A:
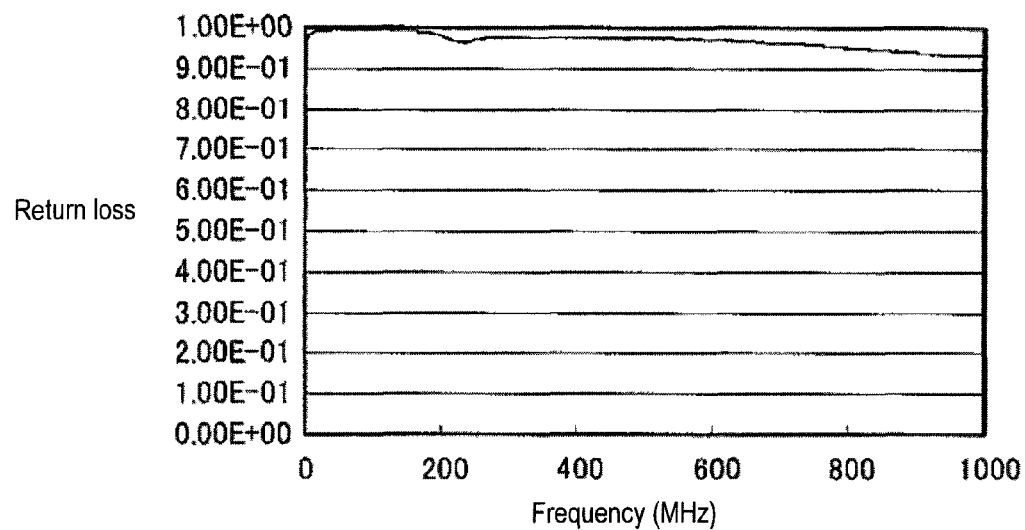
FIGS. 5A and 5B show a return loss characteristic in an $S_{11}$ parameter of the printed circuit board according to the first exemplary embodiment of the invention, FIG. 5A being a return loss characteristic graph of the printed circuit board shown in FIGS. 1A and 1B, FIG. 5B being a return loss characteristic graph of the printed circuit board where the electromagnetic radiation suppressing member has been removed from the printed circuit board shown in FIGS. 1A and 1B.
Figure 5B:
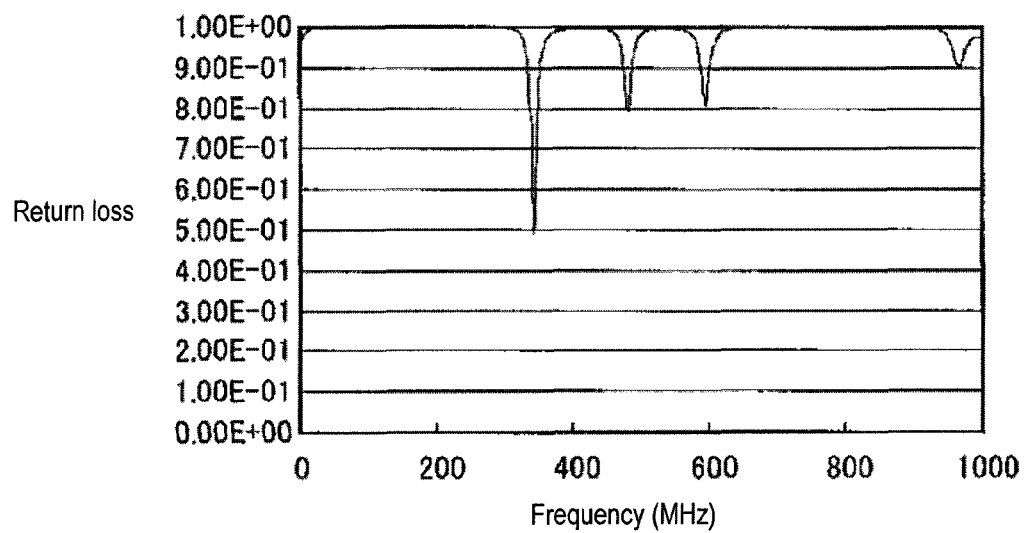

FIGS. 5A and 5B show a return loss (reflection loss) characteristic in an $S_{11}$ (input reflection coefficient) parameter of the printed circuit board according to the first exemplary embodiment of the invention. FIG. 5A is a return loss characteristic graph of the printed circuit board shown in FIGS. 1A and 1B. FIG. 5B is a return loss characteristic graph of the printed circuit board where the electromagnetic radiation suppressing member has been removed from the printed circuit board shown in FIGS. 1A and 1B. As shown in FIG. 5B, return loss appears in plural resonance frequencies in the printed circuit board (background-art configuration) where the electromagnetic radiation suppressing member 20 is absent from the printed circuit board 100. On the other hand, in the printed circuit board 100 according to this exemplary embodiment shown in FIG. 5A, no resonance occurs, but the return loss is slight.

(Comparison in Suppression of EMI)

Figure 6A:
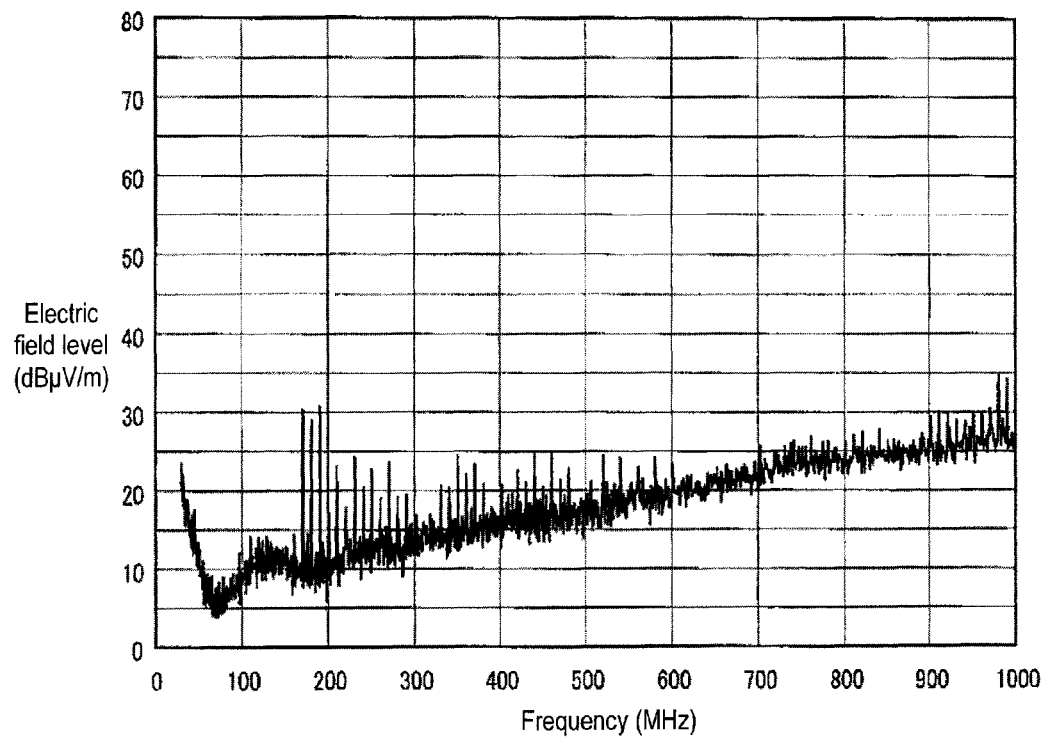
FIGS. 6A and 6B show an EMI suppressing effect, FIG. 6A being an electromagnetic radiation characteristic graph of the printed circuit board shown in FIGS. 1A and 1B, FIG. 6B being an electromagnetic radiation characteristic graph of the printed circuit board where the electromagnetic radiation suppressing member has been removed from the printed circuit board shown in FIGS. 1A and 1B.
Figure 6B:
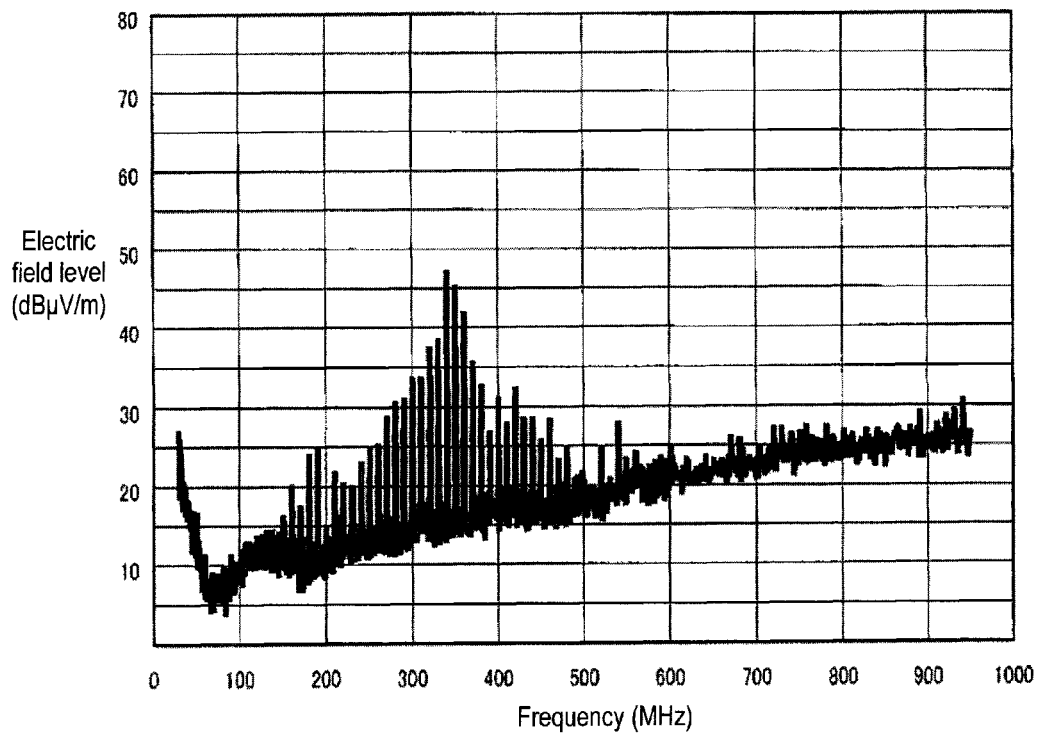

FIGS. 6A and 6B show the effect of suppression of EMI (ElectroMagnetic Interference). FIG. 6A is an electromagnetic radiation characteristic graph of the printed circuit board shown in FIGS. 1A and 1B. FIG. 6B is an electromagnetic radiation characteristic graph of the printed circuit board where the electromagnetic radiation suppressing member has been removed from the printed circuit board shown in FIGS. 1A and 1B. These characteristics were obtained by applying a clock signal of 10 MHz between the power source layer 3 and the ground layer 4 and receiving and measuring radiation noise with a horizontal antenna.

As shown in FIG. 6B, electromagnetic radiation causing EMI near a primary resonance frequency of 350 MHz occurs in the printed circuit board (background-art configuration) where the electromagnetic radiation suppressing member 20 is absent from the printed circuit board 100. On the other hand, in the printed circuit board 100 according to this exemplary embodiment shown in FIG. 6A, EMI near 350 MHz is suppressed to be not higher than 60% in peak magnitude as compared with the characteristic shown in FIG. 6B.

[Second Exemplary Embodiment]

Figure 7A:
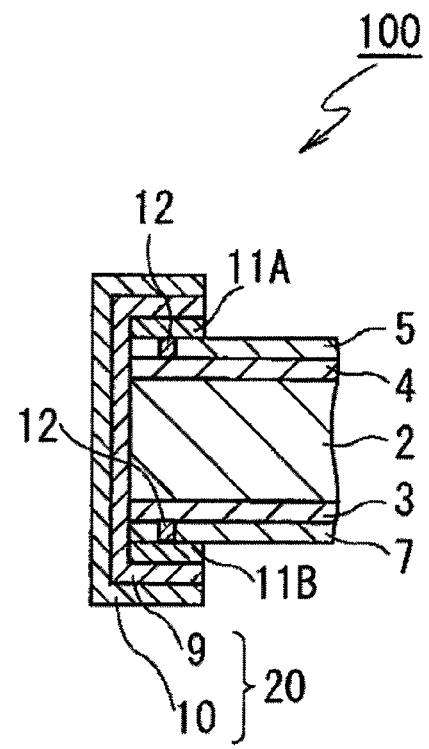
FIGS. 7A and 7B show a printed circuit board according to a second exemplary embodiment of the invention, FIG. 7A being a sectional view of a main portion of the same, FIG. 7B being a plan view of the same.
Figure 7B:
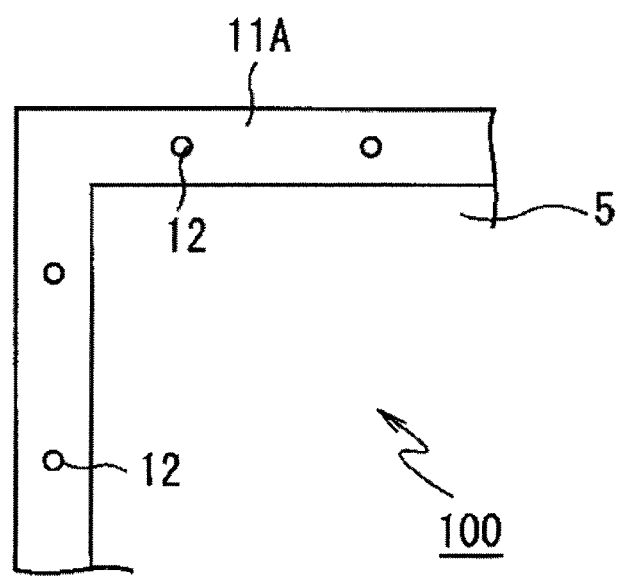

FIGS. 7A and 7B show a printed circuit board according to a second exemplary embodiment of the invention. FIG. 7A is a sectional view of a main portion, and FIG. 7B is a plan view of the main portion. In FIG. 7B, the electromagnetic radiation suppressing member 20 is not shown.

According to this exemplary embodiment, the first exemplary embodiment is adapted as follows. That is, the first and second insulating substrate layers 5 and 7 are formed in the same size as the insulating layer 2. Further, belt-like metal pads (metal layers) 11A and 11B are provided in the peripheries of the surfaces of the first and second insulating substrate layers 5 and 7. The metal pads 11A and 11B are connected to the power source layer 3 and the ground layer 4 through plural via holes (interlayer connection members) 12. The remaining configuration is the same as that of the first exemplary embodiment. Each metal pad 11A, 1B may be made to have a desired width.

[Third Exemplary Embodiment]

Figure 8:
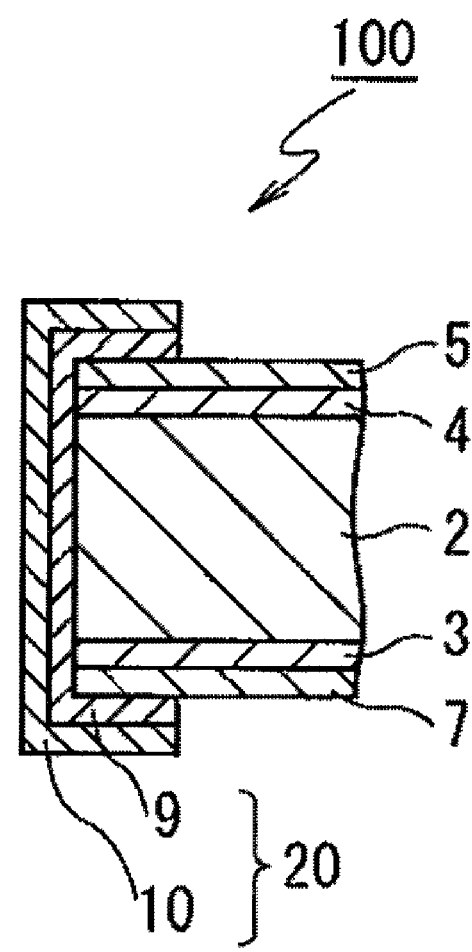
FIG. 8 is a sectional view showing a main portion of a printed circuit board according to a third exemplary embodiment of the invention.

FIG. 8 is a sectional view showing a main portion of a printed circuit board according to a third exemplary embodiment of the invention. According to this exemplary embodiment, configuration is different from that of the first exemplary embodiment in that the first and second insulating substrate layers 5 and 7 are formed in the same size as the insulating layer 2, end portions of the power source layer 3 and the ground layer 4 are covered with prepregs of the first and second insulating substrate layers 5 and 7, and further, predetermined portions of the surfaces of the first and second insulating substrate layers 5 and 7 are covered with the opposite end portions of the insulating sheet 9 and the thin film layer 10 of the electromagnetic radiation suppressing member 20. The remaining configuration is the same as that of the first exemplary embodiment.

[Fourth Exemplary Embodiment]

Figure 9:
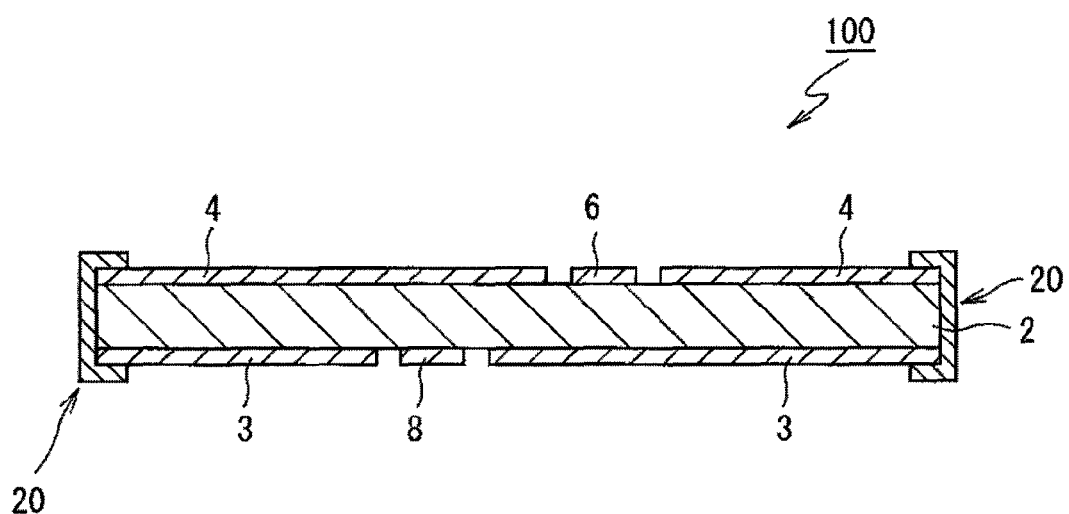
FIG. 9 is a sectional view showing the whole of a printed circuit board according to a fourth exemplary embodiment of the invention.

FIG. 9 is a sectional view showing a main portion of a printed circuit board according to a fourth exemplary embodiment of the invention. According to this exemplary embodiment, configuration is different from that of the first exemplary embodiment in that a two-layer board is formed in such a manner that the first signal wiring layer 1 and the first and second insulating substrate layers 5 and 7 are removed from the insulating layer 2 and second and third signal wiring layers 6 and 8 are provided on the opposite surfaces of the insulating layer 2 respectively to be cut into the power source layer 3 and the ground layer 4 respectively. The remaining configuration is the same as that of the first exemplary embodiment.

[Other Exemplary Embodiments]

The foregoing description of the exemplary embodiments of the invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A printed circuit board comprising:
   a ground layer;
   a power source layer that is provided to be opposed to the ground layer;
   a signal wiring layer that transmits a signal in a predetermined frequency domain;
   an insulating layer that insulates the ground layer, the power source layer and the signal wiring layer from one another; and
   an electromagnetic radiation suppressing member that is provided to cover a circumferential edge of the insulating layer and that has a negative dielectric constant and a positive magnetic permeability in a frequency domain including the predetermined frequency domain,
   wherein the electromagnetic radiation suppressing member includes a thin film layer in which nanosized particles of metal or semiconductor are dispersed in a given density,
   wherein the electromagnetic radiation suppressing member includes an insulating sheet to which the thin film layer is bonded.

2. The printed circuit board according to claim 1, wherein the particles are of an alloy or a eutectoid made from at least one selected from the group consisting of Fe, Al, Ni, Ag, Mg, Cu, Si and C.

3. The printed circuit board according to claim 1, wherein the electromagnetic radiation suppressing member entirely covers both of side surfaces of the power source layer and side surfaces of the ground layer.

4. The printed circuit board according to claim 3, wherein the electromagnetic radiation suppressing member has a U-shape.

* * * * *